(12) United States Patent
Shimizu et al.

(10) Patent No.: US 9,173,302 B2
(45) Date of Patent: Oct. 27, 2015

(54) CONDUCTIVE ADHESIVE FILM AND SOLAR CELL MODULE

(75) Inventors: Takehiro Shimizu, Tokyo (JP); Kaoru Okaniwa, Tsukuba (JP); Naoki Fukushima, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 857 days.

(21) Appl. No.: 12/439,576

(22) PCT Filed: May 28, 2007

(86) PCT No.: PCT/JP2007/060834
§ 371 (c)(1),
(2), (4) Date: Jul. 22, 2009

(87) PCT Pub. No.: WO2008/026356
PCT Pub. Date: Mar. 6, 2008

(65) Prior Publication Data
US 2009/0288697 A1    Nov. 26, 2009

(30) Foreign Application Priority Data

Aug. 29, 2006 (JP) ................................ P2006-232381

(51) Int. Cl.
| | |
|---|---|
| *H01L 31/042* | (2014.01) |
| *H05K 3/32* | (2006.01) |
| *H01L 31/18* | (2006.01) |
| *H01L 31/05* | (2014.01) |

(52) U.S. Cl.
CPC ............ *H05K 3/323* (2013.01); *H01L 31/0512* (2013.01); *H01L 31/18* (2013.01); *H05K 2201/09945* (2013.01); *Y02E 10/50* (2013.01); *Y10T 428/25* (2015.01)

(58) Field of Classification Search
CPC .................... H01L 31/02008; H01L 31/0512; H01L 31/18
USPC ........................................................ 136/244
See application file for complete search history.

(56) References Cited

U.S. PATENT DOCUMENTS

| 5,951,786 A | 9/1999 | Gee et al. |
|---|---|---|
| 6,471,816 B1 | 10/2002 | Shuto et al. |
| 7,173,188 B2 | 2/2007 | Endo et al. |

(Continued)

FOREIGN PATENT DOCUMENTS

| EP | 0 914 027 A1 | 5/1999 |
|---|---|---|
| JP | 05-065348 | 3/1993 |

(Continued)

OTHER PUBLICATIONS

Fujii, JP2006-206843, Machine Translation, Aug. 10, 2006.*

(Continued)

*Primary Examiner* — Devina Pillay
(74) *Attorney, Agent, or Firm* — Griffin & Szipl, P.C.

(57) ABSTRACT

The conductive adhesive film of the invention is a conductive adhesive film for electrical connection between photovoltaic cell surface electrodes and wiring members, which comprises an insulating adhesive 2 and conductive particles 1 and has a (t/r) value in the range of 0.75-17.5, where r (μm) is the mean particle size of the conductive particles 1 and t (μm) is the thickness of the conductive adhesive film, wherein the content of the conductive particles 1 is 1.7-15.6 vol % based on the total volume of the conductive adhesive film.

10 Claims, 4 Drawing Sheets

(56) References Cited

U.S. PATENT DOCUMENTS

| | | | |
|---|---|---|---|
| 2002/0016016 A1* | 2/2002 | Tsuzuki et al. | 438/57 |
| 2003/0216505 A1* | 11/2003 | Akiba et al. | 524/588 |
| 2005/0039943 A1 | 2/2005 | Endo et al. | |
| 2005/0115602 A1* | 6/2005 | Senta et al. | 136/250 |
| 2007/0095387 A1* | 5/2007 | Fujii et al. | 136/251 |
| 2007/0116961 A1* | 5/2007 | Connell et al. | 428/413 |

FOREIGN PATENT DOCUMENTS

| | | | | |
|---|---|---|---|---|
| JP | 6-103819 | A | 4/1994 | |
| JP | 7-147424 | | 6/1995 | |
| JP | 07-221422 | | 8/1995 | |
| JP | 08-236796 | | 9/1996 | |
| JP | 9-312176 | | 12/1997 | |
| JP | 10-162646 | | 6/1998 | |
| JP | 10-298525 | A | 11/1998 | |
| JP | 10-313126 | | 11/1998 | |
| JP | 11-120820 | | 4/1999 | |
| JP | 2000-286436 | | 10/2000 | |
| JP | 2001-127103 | * | 5/2001 | H01L 21/60 |
| JP | 2001-343903 | A1 | 12/2001 | |
| JP | 2001-345465 | | 12/2001 | |
| JP | 2001-357897 | | 12/2001 | |
| JP | 2002-204052 | A | 7/2002 | |
| JP | 2002-226808 | | 8/2002 | |
| JP | 2003-082318 | | 3/2003 | |
| JP | 2003-234020 | A1 | 8/2003 | |
| JP | 2003-257243 | | 9/2003 | |
| JP | 2004-204256 | | 7/2004 | |
| JP | 2005-50780 | | 2/2005 | |
| JP | 2005-101519 | | 4/2005 | |
| JP | 2005-166934 | A | 6/2005 | |
| JP | 2005-243935 | | 9/2005 | |
| JP | 2005-252062 | | 9/2005 | |
| JP | 2006-008978 | | 1/2006 | |
| JP | 2006-206843 | | 8/2006 | |
| KR | 10-2006-0045846 | | 5/2006 | |
| TW | 1235759 | | 7/2005 | |
| WO | 98/03047 | | 1/1998 | |
| WO | 98/03947 | A1 | 1/1998 | |
| WO | 02/05297 | A1 | 1/2002 | |

OTHER PUBLICATIONS

Connell, U.S. Appl. No. 60/739,569, filed Nov. 30, 2005.*
JP2001-127103, Machine Translation, Basho, May 2001.*
Office Action issued Jan. 11, 2011 in a counterpart Korean application No. 10-2010-7028883.
Notification of Information Provision issued on Feb. 10, 2011 co-pending related Japanese application 2006-232381 and English translation thereof.
Notification of Information Provision issued on Jan. 28, 2011 co-pending related Japanese application 2006-232381 and English translation thereof.
International Search Report issued in corresponding application No. PCT/JP2007/060834, completed Jul. 20, 2007 and mailed Jul. 31, 2007.
PCT/IB/338 and English translation of the written opinion of the ISA mailed Mar. 12, 2009.
Office Action issued Apr. 11, 2011 in a counterpart Taiwanese application No. 096121384.
Office Action issued in a counterpart Japanese application 2006-232381 on Dec. 13, 2011 (no translation available; submitted for certification purposes).
Office Action issued in counterpart Japanese application on Nov. 5, 2013 (no translation available; submitted for certification).
Search report issued in a counterpart European application No. EP07744268, completed Dec. 17, 2009 and mailed Dec. 29, 2009.

* cited by examiner

CONDUCTIVE ADHESIVE FILM AND SOLAR CELL MODULE

This is a National Phase Application in the United States of International Patent Application No. PCT/JP2007/060834 filed May 28, 2007, which claims priority on Japanese Patent Application No. 2006-232381, filed Aug. 29, 2006. The entire disclosures of the above patent applications are hereby incorporated by reference.

TECHNICAL FIELD

The present invention relates to a conductive adhesive film and to a solar cell module.

BACKGROUND ART

Solar cell modules have a construction wherein a plurality of photovoltaic cells are connected in series and/or in parallel via wiring members that are electrically connected to their surface electrodes. Solder has traditionally been used for connection between photovoltaic cell surface electrodes and wiring members during the fabrication of such solar cell modules (see Patent documents 1 and 2, for example). Solder is widely used because of its excellent connection reliability, including conductivity and anchoring strength, low cost and general applicability.

Wiring connecting methods that do not employ solder are known, such as connecting methods using conductive adhesives and connecting methods using conductive films (see Patent documents 3-6, for example).

[Patent document 1] Japanese Unexamined Patent Publication No. 2004-204256
[Patent document 2] Japanese Unexamined Patent Publication No. 2005-050780
[Patent document 3] Japanese Unexamined Patent Publication No. 2000-286436
[Patent document 4] Japanese Unexamined Patent Publication No. 2001-357897
[Patent document 5] Japanese Patent Publication No. 3448924
[Patent document 6] Japanese Unexamined Patent Publication No. 2005-101519

DISCLOSURE OF THE INVENTION

Problems to be Solved by the Invention

When connecting photovoltaic cell surface electrodes and wiring members using solder, given a solder melting temperature of generally about 230-260° C., the high temperature of connection and the volume shrinkage of the solder adversely affect the photovoltaic cell semiconductor structure, often resulting in deteriorated characteristics of the photovoltaic cells.

In addition, due to the properties of solder with solder connections, it is difficult to control the thickness at the connection interface with the adherend, and this has been an obstacle to sufficient dimensional precision for packages. When sufficient dimensional precision cannot be achieved, product yield tends to be reduced during the packaging process.

Even when connection is established between the photovoltaic cell surface electrodes and wiring members using a conductive adhesive as described in Patent documents 3-5, adequate connection reliability is not always achieved and the characteristics can undergo significant deterioration with time under high-temperature, high-humidity conditions.

Furthermore, although bonding can be achieved at low temperature when a conductive film is used for connection between the photovoltaic cell surface electrodes and wiring members as described in Patent document 6, thus minimizing the adverse effects on photovoltaic cells that result when solder is used, the connection reliability is not always sufficient because effects of the surface condition of the adherend are not taken into account.

It is an object of the present invention, which has been accomplished in light of the aforementioned problems of the prior art, to provide a conductive adhesive film which is used for connection of photovoltaic cells on a single-crystal, polycrystalline or amorphous silicon wafer or compound semiconductor wafer via wiring members, which allows connection between the photovoltaic cell surface electrodes and wiring members to be established without adversely affecting the photovoltaic cells and which allows satisfactory connection reliability to be achieved, as well as a solar cell module employing it.

Means for Solving the Problems

In order to achieve the object stated above, the invention provides a conductive adhesive film for electrical connection between photovoltaic cell surface electrodes and wiring members, which comprises an insulating adhesive and conductive particles and has a (t/r) value in the range of 0.75-17.5, where r (μm) is the mean particle size of the conductive particles and t (μm) is the thickness of the conductive adhesive film, wherein the content of conductive particles is 1.7-15.6 vol % based on the total volume of the conductive adhesive film.

The conductive adhesive film of the invention having such a construction allows connection to be established between photovoltaic cell surface electrodes and wiring members without adversely affecting the photovoltaic cells, and can provide satisfactory connection reliability.

The insulating adhesive in the conductive adhesive film of the invention preferably contains a rubber component at 9-34 mass % based on the total mass of the insulating adhesive.

The elastic modulus of the conductive adhesive film of the invention is preferably 0.5-4.0 GPa.

Also, the shapes of the conductive particles in the conductive adhesive film of the invention are preferably burr-shaped or spherical.

The invention further provides a solar cell module having a construction with a plurality of photovoltaic cells with surface electrodes connected via wiring members electrically connected to their surface electrodes, wherein the surface electrodes and wiring members are connected by a conductive adhesive film according to the invention.

Since this type of solar cell module has photovoltaic cell surface electrodes and wiring members connected using a conductive adhesive film of the invention as described above, there is no adverse effect on the photovoltaic cells and sufficient connection reliability is achieved.

Effect of the Invention

According to the invention it is possible to provide a conductive adhesive film which allows connection to be established between photovoltaic cell surface electrodes and wiring members without adversely affecting the photovoltaic cells, and can provide satisfactory connection reliability, as well as a solar cell module employing the same.

EXPLANATION OF SYMBOLS

Figure 1:
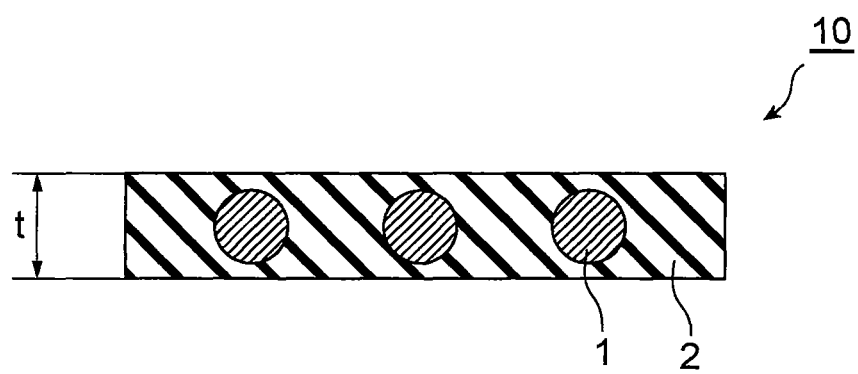
FIG. 1 is a schematic cross-sectional view showing an embodiment of a conductive adhesive film according to the invention.

1: Conductive particles, 2: insulating adhesive, 3: surface electrode, 3a: bus electrode (surface electrode), 3b: bus electrode (surface electrode), 4: wiring member, 6: semiconductor wafer, 7: finger electrode, 8: rear electrode, 10: conductive adhesive film, 100: solar cell module.

BEST MODE FOR CARRYING OUT THE INVENTION

Preferred embodiments of the invention will now be explained in detail, with reference to the accompanying drawings. Identical or corresponding parts in the drawings will be referred to by like reference numerals and will be explained only once.

FIG. 1 is a schematic cross-sectional view showing an embodiment of a conductive adhesive film according to the invention. As shown in FIG. 1, the conductive adhesive film 10 of the invention comprises at least conductive particles 1 and an insulating adhesive 2.

The conductive adhesive film 10 of the invention serves to connect photovoltaic cell electrodes and wires (wiring members) used to link the solar cells in series and/or in parallel. Electrodes (surface electrodes) are formed on the front and back sides of the photovoltaic cell to withdraw energy.

The surface electrodes may be made of known materials capable of electrical conduction, and as examples there may be mentioned common silver-containing glass paste, or silver paste, gold paste, carbon paste, nickel paste or aluminum paste obtained by dispersing conductive particles in adhesive resins, and ITO formed by firing or vapor deposition. Silver-containing glass paste electrodes are preferred among these from the viewpoint of heat resistance, conductivity, stability and cost.

Photovoltaic cells generally have an Ag electrode and an Al electrode each formed as surface electrodes by screen printing or the like, on a substrate composed of at least one or more Si single-crystal, polycrystal or amorphous materials.

The electrode surfaces usually have irregularities with a surface roughness (ten-point average surface roughness Rz) of 3-30 μm. In most cases, the electrodes formed on the photovoltaic cells are rough, with a surface roughness Rz of 8-18 μm. As a result of much ardent research, the present inventors have found that the connection reliability deteriorates in conventional conductive adhesive compositions and conductive films because of these irregularities.

That is, without small conductive particle sizes and suitable contents in electrode surfaces with irregular shapes, the particles become embedded in the recesses of the electrode surfaces resulting in inadequate conductivity. Moreover, when the thickness of the coated film formed using a conductive adhesive composition or conductive film is smaller than the difference in elevation of the irregularities on the electrode surface, it becomes impossible to obtain sufficient adhesion with adherends and the connection reliability is thus reduced.

Furthermore, an excessive coated film thickness with respect to the conductive particle sizes interferes with sufficient elimination of the resin of the conductive particles surface during thermocompression bonding, thus reducing the conductivity. If the ratio of the mean particle size r (μm) of the conductive particles and the thickness t (μm) of the coated film that is formed (coated film thickness t/conductive particle mean particle size r) is less than 0.75, filling with the adhesive component becomes insufficient and poor connectivity is likely to result.

The present inventors have found that sufficient connection reliability between adherends is largely dependent on the ratio between the particle sizes (mean particle size) of the conductive particles dispersed in the insulating adhesive component and the thickness of the coated film that is formed (the conductive adhesive film thickness) between the conductive adhesive film and the irregularities on the electrode surface.

The thickness of the conductive adhesive film specified according to the invention may be measured using a micrometer. The mean particle size of the conductive particles may be the average of the particle sizes of 20 measured particles when the conductive particles are observed at 3,000× using a scanning electron microscope (SEM).

The conductive adhesive film 10 of the invention must have a ratio between the mean particle size r (μm) of the conductive particles in the conductive adhesive film 10 and the thickness t (μm) of the conductive adhesive film 10 (film thickness t/mean particle size r) of 0.75-17.5, and the content of the conductive particles 1 in the conductive adhesive film 10 must be 1.7-15.6 vol % based on the total volume of the conductive adhesive film 10.

If the ratio between the mean particle size r of the conductive particles 1 and the thickness t of the conductive adhesive film 10 (t/r) is 0.75-17.5 and the content of the conductive particles 1 is 1.7-15.6 vol % based on the total volume of the conductive adhesive film 10, conductivity will be achieved between the particles even if one of the conductive particles becomes buried in a recess on the adherend surface, thus helping to ensure sufficient electrical connection between the adherends.

Figure 2:
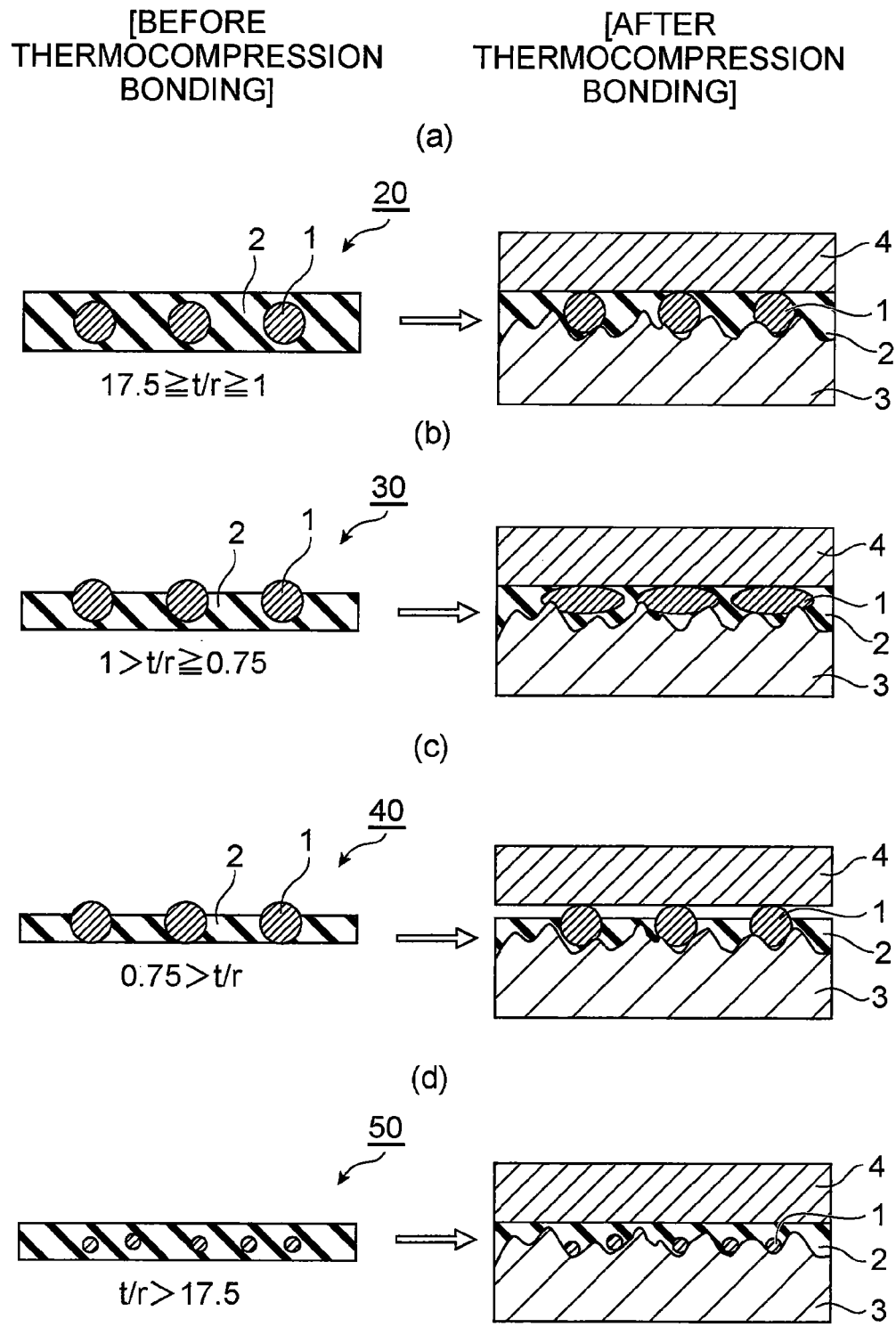
FIG. 2 is a set of illustrations showing the states of connection between adherends when using conductive adhesive films with different (t/r) values.

FIG. 2 is a set of illustrations for explanation of connection between adherends when using conductive adhesive films. FIGS. 2(a) to (d) show connection states when using conductive adhesive films with different (t/r) values, and specifically when using a conductive adhesive film 20 with a (t/r) value of 1-17.5 (FIG. 2(a)), a conductive adhesive film 30 with a (t/r) value of at least 0.75 and less than 1 (FIG. 2(b)), a conductive adhesive film 40 with a (t/r) value of less than 0.75 (FIG. 2(c)) and a conductive adhesive film 50 with a (t/r) value of greater than 17.5 (FIG. 2(d)). The adherends used were a photovoltaic cell surface electrode 3 and a wiring member 4 for connection between photovoltaic cells, and the surface electrode 3 had irregularities on the surface. FIG. 2 also shows a case where the conductive adhesive film is situated between the adherends and connection is established by thermocompression bonding.

When using the conductive adhesive film 20 shown in FIG. 2(a), the irregularities on the surface electrode 3 can be sufficiently filled with the conductive particles 1 and bonding and electrical connection between the surface electrode 3 and wiring member 4 can be satisfactorily established. When using the conductive adhesive film 30 shown in FIG. 2(b), the conductive particles 1 become deformed and embedded in the surface electrode and the irregularities on the surface electrode 3 can be sufficiently filled with the conductive particles 1, so that bonding and electrical connection between the surface electrode 3 and wiring member 4 can be satisfactorily established.

When using the conductive adhesive film 40 shown in FIG. 2(c), on the other hand, the mean particle size of the conductive particles 1 is too large with respect to the thickness of the film, and therefore even with deformation of the conductive particles 1 or their embedding into the surface electrode, the insulating adhesive 2 and wiring member 4 fail to come into contact and bonding cannot be achieved. When using the conductive adhesive film 50 shown in FIG. 2(d), the mean particle size of the conductive particles 1 is too small with respect to the thickness of the film, and therefore the conductive particles 1 fill the recesses of the surface electrode 3, making it impossible to ensure electrical connection.

Thus, limiting the value of (t/r) for the conductive adhesive film to within the range of 0.75-17.5 can guarantee satisfactory connection between adherends. From the viewpoint of obtaining even more satisfactory connection between adherends, the value of (t/r) is preferably 1.0-12.0 and more preferably 2.0-9.0.

The conductive adhesive film 10 of the invention comprises at least an insulating adhesive component 2 and conductive particles 1. There are no particular restrictions on the insulating adhesive component 2, but a thermosetting resin is preferably used from the viewpoint of connection reliability. Any publicly known thermosetting resin may be used, examples of which include epoxy resins, phenoxy resins, acrylic resins, polyimide resins, polyamide resins, polycarbonate resins and the like, although one or more from among epoxy resins, phenoxy resins and acrylic resins are preferred from the viewpoint of obtaining more adequate connection reliability.

From the viewpoint of the resin flow property and control of the physical properties of the film, the conductive adhesive film 10 preferably contains a rubber component as the insulating adhesive component 2. Any publicly known rubber component may be used, examples of which include acrylic rubber, butyl rubber, silicone rubber, urethane rubber, fluorine rubber and the like, although acrylic rubber is preferred from the viewpoint of miscibility with the thermosetting resin, and adhesiveness with the adherends.

The rubber component content is preferably 9-34 mass % based on the total mass of the insulating adhesive component 2. A rubber component content of 9-34 mass % based on the total mass of the insulating adhesive component 2 will result in excellent adhesiveness between the conductive adhesive film 10 and adherends, while also providing a satisfactory shape following property for physical variation in the adherend due to environmental changes, and sufficient minimization of defective connections between adherends.

There are no particular restrictions on the conductive particles 1, and for example, gold particles, silver particles, copper particles, nickel particles, gold-plated particles, copper-plated particles and nickel-plated particles may be mentioned. The conductive particles 1 are preferably burr-shaped or spherical from the viewpoint of sufficiently filling the surface irregularities of the adherend during bonding and adequately ensuring electrical connection between adherends. Specifically, burr-shaped or spherical conductive particles 1 are preferred because they can sufficiently fill irregularities even on adherend surfaces with complex irregular shapes, and because the shape following property of such conductive particles 1 is higher for variation caused by vibration or expansion after connection.

The mean particle size r of the conductive particles 1 is not particularly restricted so long as it is a mean particle size such that the value of (t/r) is in the range of 0.75-17.5, but it is preferably 2-30 μm and more preferably 10-20 μm. It will be possible to achieve more satisfactory adhesion and conduction between adherends especially when the adherend surface roughness Rz is in the range of 3-30 μm (more preferably 8-18 μm) and the mean particle size of the conductive particles 1 is within the aforementioned range. The mean particle size r of the conductive particles 1 with respect to the surface roughness of the adherend is preferably at least ½ Rz, more preferably at least Rz and even more preferably at least Ry (ten-point average surface roughness: Rz, maximum height: Ry).

The content of the conductive particles 1 in the conductive adhesive film 10 must be 1.7-15.6 vol % based on the total volume of the conductive adhesive film 10, but it is preferably 2-12 vol % and more preferably 3-8 vol % from the viewpoint of achieving more satisfactory adhesion and conduction between adherends. With a conductive particle 1 content of 1.7-15.6 vol %, the conductive adhesive film 10 will be capable of exhibiting anisotropic conductivity.

The conductive adhesive film 10 of the invention may also contain, in addition to the components mentioned above, modifying materials such as silane-based coupling agents, titanate-based coupling agents or aluminate-based coupling agents in order to improve the adhesion or wettability between the curing agent, curing accelerator and substrate, dispersing agents such as calcium phosphate or calcium carbonate in order to improve the dispersibility of the conductive particles, and chelate materials to prevent silver or copper migration.

The conductive adhesive film 10 of the invention has excellent dimensional precision of film thickness and pressure distribution during contact bonding, compared to paste-like conductive adhesive compositions. The conductive adhesive film 10 may be fabricated by, for example, coating a release film such as a polyethylene terephthalate film with a coating solution comprising the aforementioned materials dissolved or dispersed in a solvent, and then removing the solvent. The film thickness of the conductive adhesive film 10 can be controlled by adjusting the nonvolatile component in the coating solution, or by modifying the gap adjustment of the applicator or lip coater.

The elastic modulus of the conductive adhesive film 10 is preferably 0.5-4.0 GPa. If the elastic modulus is less than 0.5 GPa the film strength may be weakened, thus reducing the adhesive force, while if it is greater than 4.0 GPa the film will tend to be hard, leading to poor stress-relaxation of the adherends.

The thickness t of the conductive adhesive film 10 is not particularly restricted so long as it is a thickness such that the value of (t/r) is in the range of 0.75-17.5, but it is preferably 5-50 μm and more preferably 10-35 μm. It will be possible to achieve more satisfactory adhesion and conduction between adherends, especially when the adherend surface roughness Rz is in the range of 3-30 μm (more preferably 8-18 μm) and the thickness of the conductive adhesive film 10 is within the aforementioned range. The thickness t of the conductive adhesive film 10, with respect to the surface roughness of the adherend, is preferably at least Rz and more preferably at least Ry (ten-point average surface roughness: Rz, maximum height: Ry).

The conductive adhesive film 10 of the invention is most preferably applied in a photovoltaic cell. The solar cell may be used as a solar cell module comprising a plurality of photovoltaic cells connected in series and/or in parallel and sandwiched between tempered glass or the like for environmental resistance, and provided with external terminals wherein the gaps are filled with a transparent resin. The conductive adhesive film 10 of the invention is preferably used for connection between wiring members serving to connect a plurality of photovoltaic cells in series and/or in parallel and solar cell surface electrodes.

The solar cell module of the invention has a construction with a plurality of photovoltaic cells with surface electrodes connected via wiring members that are electrically connected to their surface electrodes, wherein the surface electrodes and wiring members are connected by a conductive adhesive film according to the invention.

Figure 3:
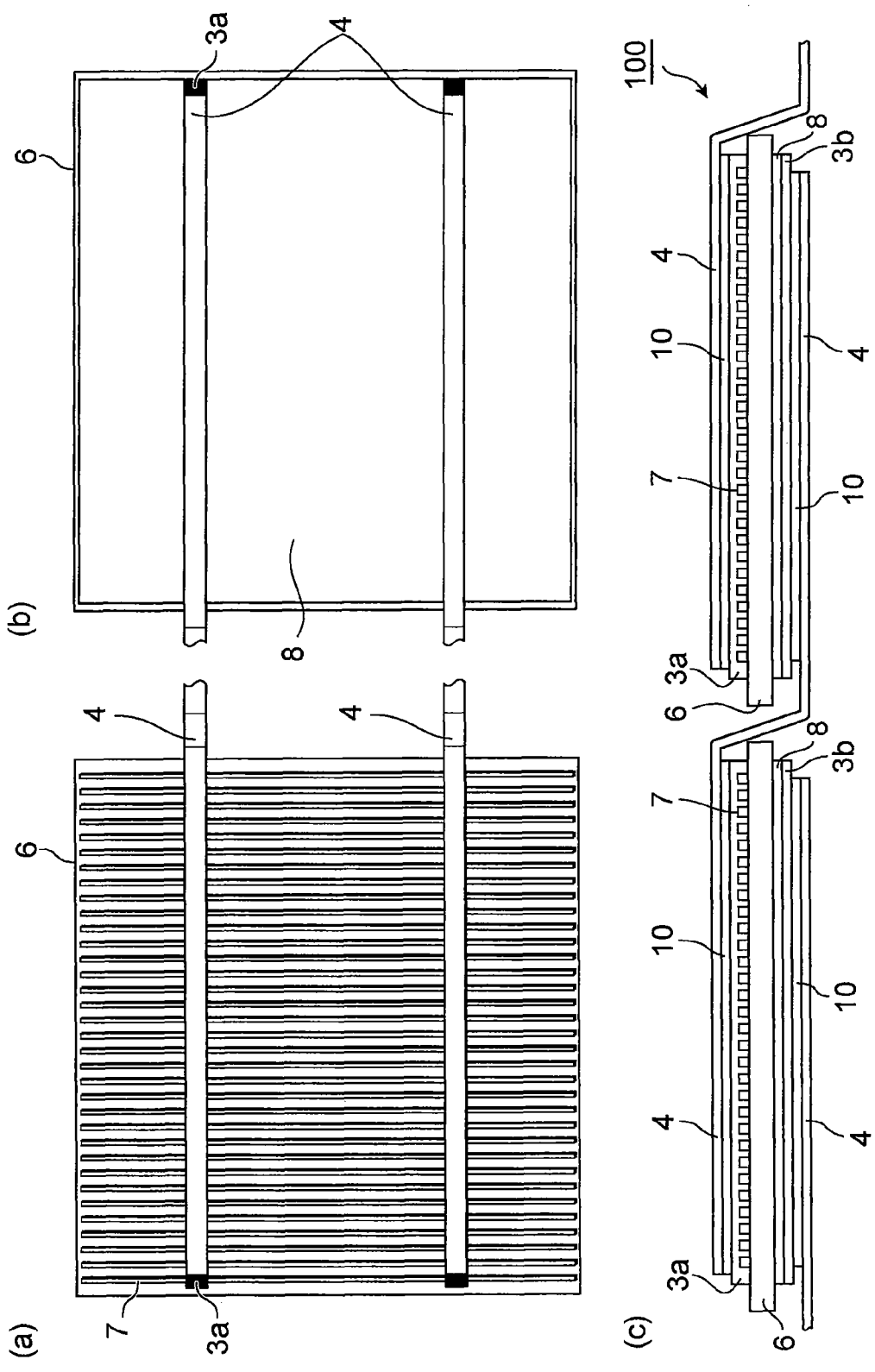
FIG. 3 is a schematic view of the essential portion of a solar cell module according to the invention.

FIG. 3 is a schematic drawing showing the essential parts of a solar cell module according to the invention, as an overview of a structure with reciprocally wire-connected photovoltaic cells. FIG. 3(a) shows the front side of the solar cell module, FIG. 3(b) shows the rear side, and FIG. 3(c) shows an edge view.

As shown in FIGS. 3(a)-(c), the solar cell module 100 has photovoltaic cells, with finger electrodes 7 and bus electrodes (surface electrodes) 3a formed on the front sides of semiconductor wafers 6 and rear electrodes 8 and bus electrodes (surface electrodes) 3b formed on the rear sides, the photovoltaic cells being reciprocally connected by wiring members 4. The wiring members 4 have one end connected to a bus electrode 3a as a surface electrode and the other end connected to a bus electrode 3b as a surface electrode, via conductive adhesive films 10 according to the invention.

Since the solar cell module 100 having this construction has the surface electrodes and wiring members connected using a conductive adhesive film of the invention as described above, there is no adverse effect on the photovoltaic cells and sufficient connection reliability is achieved.

EXAMPLES

The present invention will now be explained in greater detail based on examples and comparative examples, with the understanding that the invention is in no way limited to the examples.

<Measurement of Physical Properties>

(1) Film thickness of conductive adhesive film: This was measured using a micrometer (ID-C112 by Mitsutoyo Corp). When t/r was less than 1, a focal depth gauge was used to measure the film thickness at a section without conductive particles.

(2) Surface roughness of adherend (ten-point average surface roughness Rz, maximum height Ry): A laser three-dimensional profile microscope (VK-8510 by KEYENCE) was used for observation and image computation and analysis software (VK-H1A7 by KEYENCE) was used for calculation. Recording of the ten-point average surface roughness Rz and maximum height Ry was according to JIS B0601-1994.

(3) Elastic modulus of conductive adhesive film: The conductive adhesive composition was coated onto a polyethylene terephthalate film with a silicone-treated surface using an applicator (Yoshimisu) and then dried in an oven at 170° C. for 20 minutes. The polyethylene terephthalate film was then released to obtain a 35 μm-thick conductive adhesive film. A 5 mm-wide, 35 mm-long strip was cut out from the obtained conductive adhesive film, and the elastic modulus was measured at 25° C. using a dynamic viscoelasticity meter (SOLIDS ANALYZER by Rheometric Scientific, chuck distance: 2 cm).

(4) Peel strength measurement (MPa): After fabricating a photovoltaic cell with tab wires, the ends of the tab wires were bent perpendicular and anchored in the chuck of a peel strength tester (STA-1150 by Orientech), for measurement of the peel strength with a pull rate of 2 cm/s. Generation of cracking in the wafer prior to peeling of the tab wires may be considered to indicate sufficient peel strength.

(5) Wafer warpage (%): A photovoltaic cell with tab wires was placed on a smooth surface with its convex side (the side opposite the tab-wired side) in contact with the smooth surface, one edge thereof (an edge against the lengthwise direction of the tab wires) was fixed to the smooth surface, any raised areas of the opposite edge from the smooth surface were measured at 5 points using a focal depth gauge, and the average value was calculated. The proportion of the average value of the measured raised areas with respect to the length of one side of the photovoltaic cell was calculated as the wafer warpage (%).

Figure 4:
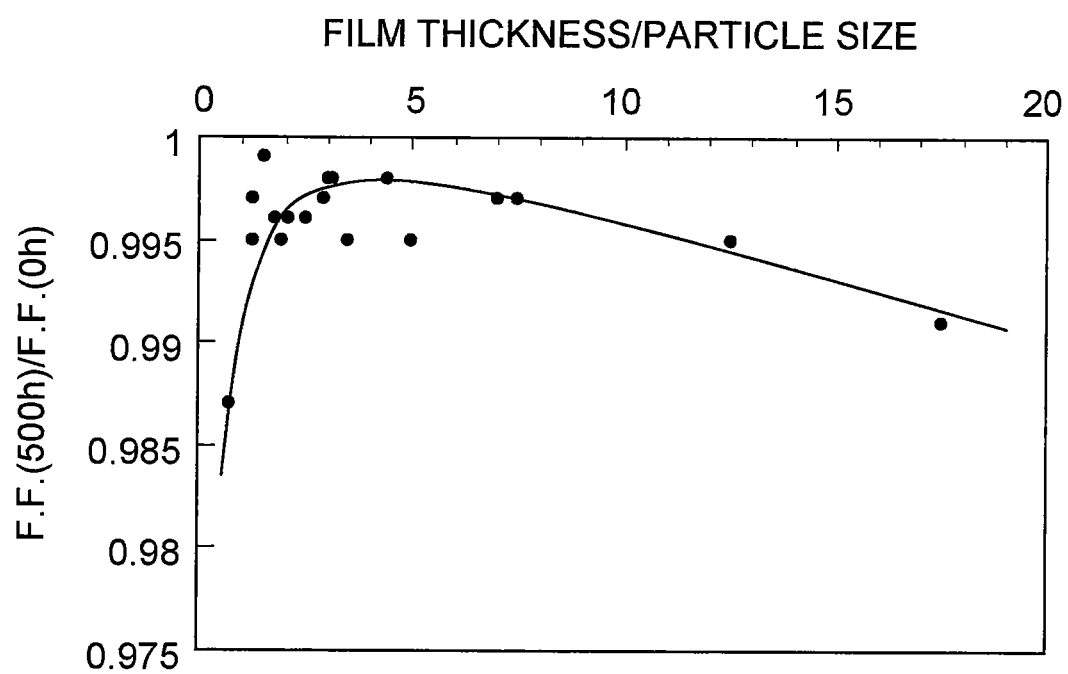
FIG. 4 is a graph showing the relationship between the ratio of the film thickness t of the conductive adhesive film and the mean particle size r of the conductive particles ((film thickness t/particle size r), and the change in fill factor (F.F.) after 500 hours in an 85° C., 85% RH atmosphere {F.F.(500 h)/F.F.(0 h)}.

(6) F.F.(500 h)/F.F.(0 h): The IV curve of the photovoltaic cell with tab wires was measured using a solar simulator (WXS-155S-10, AM1.5G) by Wacom Electric Co., Ltd., and the initial F.F. (fill factor) and the F.F. after standing for 500 hours in an atmosphere of 85° C., 85% RH were determined. The value of the F.F. after 500 hours divided by the initial F.F. was also determined, as F.F.(500 h)/F.F.(0 h). The relationship between the value of t/r and the value of F.F.(500 h)/F.F.(0 h) is shown in the graph in FIG. 4. From FIG. 4 it can be discerned that connection reliability is insufficient when the value of the F.F.(500 h) after 500 hours/F.F.(0 h) is 0.98 or smaller.

(7) Cell yield: The condition of 10 photovoltaic cells after tab wiring was observed, and the proportion (%) of cells without cracking or peeling was determined as the yield.

Examples 1-1 to 1-3

First, acrylic rubber obtained by copolymerizing 40 parts by mass of butyl acrylate, 30 parts by mass of ethyl acrylate, 30 parts by mass of acrylonitrile and 3 parts by mass of glycidyl methacrylate was prepared (KS8200H, product of Hitachi Chemical Co., Ltd., molecular mass: 850,000). Next, 125 g of this acrylic rubber and 50 g of a phenoxy resin (PKHC, product of Union Carbide Corp., weight-average molecular weight: 45,000) were dissolved in 400 g of ethyl acetate to obtain a 30% solution. After then adding 325 g of a liquid epoxy containing a microcapsule-type latent curing agent (NOVACURE HX-3941HP, product of Asahi Kasei Chemicals Corp., epoxy equivalents: 185) to the solution, the mixture was stirred to obtain an adhesive composition. The contents of the materials in the adhesive composition are shown in Table 1.

TABLE 1

| Material | Content (parts by mass) |
| --- | --- |
| Phenoxy resin | 50 |
| Acrylic rubber | 125 |
| Ethyl acetate | 400 |
| Curing agent-containing epoxy | 325 |

Conductive particles with a mean particle size of 2 μm (spherical conductive particles obtained by forming a Ni and Au layer each to a 0.1 μm thickness on the surfaces of 1.8 μm-diameter polystyrene-based nuclei; specific gravity: 2.8) were dispersed in the adhesive composition to obtain a conductive adhesive composition. The conductive particles were combined to a content of 5 vol % based on the total volume of the conductive adhesive composition solid portion. The mean particle size of the conductive particles was determined by measuring the particle sizes of 20 arbitrary conductive particles when observing the conductive particles under 3000× magnification with a SEM (S-510 by Hitachi, Ltd.), and calculating the average value. The conductive particle content was calculated from the particle specific gravity.

The obtained conductive adhesive composition was coated onto a polyethylene terephthalate film using an applicator (product of Yoshimisu) and dried on a hot plate at 70° C. for 3 minutes to fabricate conductive adhesive films having film thicknesses of 15 μM (Example 1-1), 25 μm (Example 1-2) and 35 μm (Example 1-3). The film thickness was adjusted by varying the applicator gap. The gap was adjusted to obtain the desired film thickness, based on a relational formula for the gap and the post-drying thickness.

Each of the obtained conductive adhesive films was cut to the width (2 mm) of electrode wiring (material: silver glass paste, 2 mm×12.5 cm, Rz=10 μm, Ry=14 μm) formed on a photovoltaic cell (125 mm×125 mm, 310 μm width), and placed between TAB wires by Hitachi Cable, Ltd. (A-TPS, product of Hitachi Cable, Ltd.) serving as the wiring members and the solar cell surface electrode. Next, a contact bonding tool (AC-S300, product of Nikka Equipment & Engineering Co., Ltd.) was used for contact bonding at 170° C., 2 MPa for 20 seconds, to establish connection between the electrode wiring (surface electrode) on the front side of the photovoltaic cell and the TAB wires (wiring members) via the conductive adhesive film, as shown in FIG. 3. The obtained photovoltaic cells with tab wires were evaluated by verification of outer appearance (presence of cell cracking or tab wire peeling), and measurement of the peel strength and the F.F. (500 h)/F.F.(0 h) of the solar cells. The outer appearance was visually examined, and an evaluation of A was assigned if no cell cracking or tab wire peeling occurred, or B if cracking occurred in part of the cell. The evaluation results are shown in Tables 2 and 3.

Examples 2-1 to 2-3

The same materials were used as in Examples 1-1 to 1-3, with the same procedure as in Examples 1-1 to 1-3 and the same evaluation as in Examples 1-1 to 1-3, except that the conductive particles used were conductive particles with a mean particle size of 5 μm (spherical conductive particles obtained by forming a Ni and Au layer each to a 0.1 μm thickness on the surfaces of 4.8 μm-diameter polystyrene-based nuclei; specific gravity: 2.8). The evaluation results are shown in Tables 2 and 3.

Examples 3-1 to 3-3

The same materials were used as in Examples 1-1 to 1-3, with the same procedure as in Examples 1-1 to 1-3 and the same evaluation as in Examples 1-1 to 1-3, except that the conductive particles used were conductive particles with a mean particle size of 10 μm (spherical conductive particles obtained by forming a Ni and Au layer each to a 0.1 μm thickness on the surfaces of 9.8 μm-diameter polystyrene-based nuclei; specific gravity: 2.8). The evaluation results are shown in Tables 2 and 3.

Examples 4-1 to 4-3

The same materials were used as in Examples 1-1 to 1-3, with the same procedure as in Examples 1-1 to 1-3 and the same evaluation as in Examples 1-1 to 1-3, except that the conductive particles used were conductive particles with a mean particle size of 20 μm (spherical conductive particles obtained by forming a Ni and Au layer each to a 0.1 μm thickness on the surfaces of 19.8 μm-diameter polystyrene-based nuclei; specific gravity: 2.8).

The evaluation results are shown in Tables 2 and 3.

Examples 5-1 to 5-3

The same materials were used as in Examples 1-1 to 1-3, with the same procedure as in Examples 1-1 to 1-3 and the same evaluation as in Examples 1-1 to 1-3, except that the conductive particles used were conductive particles with a mean particle size of 12 μm (burr-shaped nickel particles; specific gravity: 3.36). The evaluation results are shown in Tables 2 and 3.

Examples 6-1 to 6-3

The same materials were used as in Examples 1-1 to 1-3, with the same procedure as in Examples 1-1 to 1-3 and the same evaluation as in Examples 1-1 to 1-3, except that the conductive particles used were conductive particles with a mean particle size of 8 μm (spherical conductive particles obtained by forming a Ni and Au layer each to a 0.1 μm thickness on the surfaces of 7.8 μm-diameter polystyrene-based nuclei; specific gravity: 8.6). The evaluation results are shown in Tables 2 and 3.

Comparative Example 1

TAB wires (A-TPS, product of Hitachi Cable, Ltd.) and a photovoltaic cell were solder-connected by heat-fusing the TAB wires with a lamp heater. The obtained photovoltaic cell with tab wires was evaluated in the same manner as Examples 1-1 to 1-3. The evaluation results are shown in Tables 2 and 3.

TABLE 2

| | | Conductive adhesive film | | | | | | |
| | | Film | Elastic | | Conductive particles | | | |
| | Adhesive form | thickness (μm) | modulus (GPa) | Content (vol %) | Type | Shape | Specific gravity | Mean particle size (μm) |
| --- | --- | --- | --- | --- | --- | --- | --- | --- |
| Example 1-1 | Film | 15 | 1.4 | 5 | Gold-plated | Spherical | 2.8 | 2 |
| Example 1-2 | | 25 | | | | | | |

TABLE 2-continued

| | Conductive adhesive film | | | | | | |
|---|---|---|---|---|---|---|---|
| | | Film | Elastic | Conductive particles | | | |
| | Adhesive form | thickness (μm) | modulus (GPa) | Content (vol %) | Type | Shape | Specific gravity | Mean particle size (μm) |
| Example 1-3 | | 35 | | | plastic | | | |
| Example 2-1 | Film | 15 | 1.4 | 5 | Gold-plated plastic | Spherical | 2.8 | 5 |
| Example 2-2 | | 25 | | | | | | |
| Example 2-3 | | 35 | | | | | | |
| Example 3-1 | Film | 15 | 1.4 | 5 | Gold-plated plastic | Spherical | 2.8 | 10 |
| Example 3-2 | | 25 | | | | | | |
| Example 3-3 | | 35 | | | | | | |
| Example 4-1 | Film | 15 | 1.4 | 5 | Gold-plated plastic | Spherical | 2.8 | 20 |
| Example 4-2 | | 25 | | | | | | |
| Example 4-3 | | 35 | | | | | | |
| Example 5-1 | Film | 15 | 1.4 | 5 | Nickel | Burr-shaped | 3.36 | 12 |
| Example 5-2 | | 25 | | | | | | |
| Example 5-3 | | 35 | | | | | | |
| Example 6-1 | Film | 15 | 1.4 | 5 | Gold-plated plastic | Spherical | 8.6 | 8 |
| Example 6-2 | | 25 | | | | | | |
| Example 6-3 | | 35 | | | | | | |
| Comp. Ex. 1 | Solder | — | — | — | — | — | — | — |

TABLE 3

| | Appearance | Peel strength (MPa) | t/r | F.F. (500 h)/ F.F. (0 h) | Wafer warpage (%) | Cell yield (%) |
|---|---|---|---|---|---|---|
| Example 1-1 | A | Wafer breakage | 7.5 | 0.997 | ≤0.3 | 100 |
| Example 1-2 | A | Wafer breakage | 12.5 | 0.995 | ≤0.3 | 100 |
| Example 1-3 | A | Wafer breakage | 17.5 | 0.991 | ≤0.3 | 100 |
| Example 2-1 | A | Wafer breakage | 3 | 0.998 | ≤0.3 | 100 |
| Example 2-2 | A | Wafer breakage | 5 | 0.995 | ≤0.3 | 100 |
| Example 2-3 | A | Wafer breakage | 7 | 0.997 | ≤0.3 | 100 |
| Example 3-1 | A | Wafer breakage | 1.5 | 0.999 | ≤0.3 | 100 |
| Example 3-2 | A | Wafer breakage | 2.5 | 0.996 | ≤0.3 | 100 |
| Example 3-3 | A | Wafer breakage | 3.5 | 0.995 | ≤0.3 | 100 |
| Example 4-1 | A | Wafer breakage | 0.75 | 0.987 | ≤0.3 | 100 |
| Example 4-2 | A | Wafer breakage | 1.25 | 0.997 | ≤0.3 | 100 |
| Example 4-3 | A | Wafer breakage | 1.75 | 0.996 | ≤0.3 | 100 |
| Example 5-1 | A | Wafer breakage | 1.25 | 0.995 | ≤0.3 | 100 |
| Example 5-2 | A | Wafer breakage | 2.1 | 0.996 | ≤0.3 | 100 |
| Example 5-3 | A | Wafer breakage | 2.9 | 0.997 | ≤0.3 | 100 |
| Example 6-1 | A | Wafer breakage | 1.9 | 0.995 | ≤0.3 | 100 |
| Example 6-2 | A | Wafer breakage | 3.1 | 0.998 | ≤0.3 | 100 |
| Example 6-3 | A | Wafer breakage | 4.4 | 0.998 | ≤0.3 | 100 |
| Comp. Ex. 1 | B | Wafer breakage | — | Cracking in cell, unmeasurable | 3 | 80 |

INDUSTRIAL APPLICABILITY

As explained above, it is possible according to the invention to provide a conductive adhesive film which allows connections to be established between photovoltaic cell surface electrodes and wiring members without adversely affecting the photovoltaic cells, and can provide satisfactory connection reliability, as well as a solar cell module employing the same.

We claim:

1. A solar cell module comprising a plurality of photovoltaic cells connected via a plurality of wiring members, wherein each photovoltaic cell comprises:
   (a) a plurality of surface electrodes, wherein the plurality of surface electrodes are formed on a substrate comprising at least one material selected from the group consisting of single crystalline silicon and polycrystalline silicon; and
   (b) a conductive adhesive film with a thickness of t disposed to electrically connect each surface electrode to each wiring member of the plurality of the wiring members, wherein the conductive adhesive film comprises
   (i) an insulating adhesive; and
   (ii) a plurality of conductive particles having a mean particle size r, wherein a ratio of t/r is in a range of 2.0-9.0 and a content of the conductive particles is 1.7-15.6 vol % based on a total volume of the conductive adhesive film,
   wherein the mean particle size r of the conductive particles is at least ten-point average surface roughness Rz of the surface electrodes.

2. The solar cell module according to claim 1, wherein the insulating adhesive contains a rubber component of 9-34 mass % based on a total mass of the insulating adhesive.

3. The solar cell module according to claim 1, wherein the conductive adhesive film has an elastic modulus of 0.5-4.0 GPa.

4. The solar cell module according to claim 1, wherein the conductive particles are burr-shaped or spherical in shape.

5. The solar cell module according to claim 1, wherein the mean particle size r of the conductive particles is 10-20 μm.

6. The solar cell module according to claim 1, wherein the surface electrodes are bus electrodes.

7. The solar cell module according to claim 6, wherein the conductive adhesive film is disposed on the bus electrodes.

8. The solar cell module according to claim 1, wherein the surface electrodes are electrodes formed of silver-containing glass paste.

9. The solar cell module according to claim 1, wherein the ten-point average surface roughness Rz of the surface electrodes is 10-18 μm.

10. The solar cell module according to claim 1, wherein the ten-point average surface roughness Rz of the surface electrodes is 8-10 μm, and a maximum height Ry of the surface electrodes is at least 14 μm.

* * * * *